United States Patent
Steinhoff et al.

(10) Patent No.: US 6,891,372 B2
(45) Date of Patent: May 10, 2005

(54) IMAGING METHOD

(75) Inventors: Sven Steinhoff, Aachen (DE); Nadim Joni Shah, Jülich (DE); Karl Zilles, Köln (DE)

(73) Assignee: Forschungszentrum Julich GmbH, Julich (DE)

( * ) Notice: Subject to any disclaimer, the term of this patent is extended or adjusted under 35 U.S.C. 154(b) by 122 days.

(21) Appl. No.: 10/169,222
(22) PCT Filed: Dec. 20, 2000
(86) PCT No.: PCT/DE00/04560
§ 371 (c)(1), (2), (4) Date: Aug. 19, 2002
(87) PCT Pub. No.: WO01/48691
PCT Pub. Date: Jul. 5, 2001

(65) Prior Publication Data
US 2003/0076098 A1 Apr. 24, 2003

(30) Foreign Application Priority Data
Dec. 24, 1999 (DE) ......................... 199 62 848

(51) Int. Cl.⁷ ................................. G01V 3/00
(52) U.S. Cl. ..................... 324/309; 324/307
(58) Field of Search .............. 324/309, 307, 324/306, 312, 314, 300

(56) References Cited

U.S. PATENT DOCUMENTS

| | | | |
|---|---|---|---|
| 4,845,430 A | 7/1989 | Nakabayashi | 324/309 |
| 5,523,688 A | 6/1996 | Heid et al. | 324/309 |
| 5,754,046 A * | 5/1998 | Busch et al. | 324/309 |
| 5,810,728 A * | 9/1998 | Kuhn | 600/410 |
| 6,377,834 B1 * | 4/2002 | Zhou et al. | 600/412 |

FOREIGN PATENT DOCUMENTS

WO 99/14616 3/1999

OTHER PUBLICATIONS

Slavin, G. S., et al, "Dual–Echo Interleaved Echo–Planar Imaging of the Brain," *Magnetic Resonance in Medicine* 33:264–270, XP 000482950 (1995).

Loenneker, T., et al, "Multislice Interleaved Excitation Cycles (MUSIC): An Efficient Gradient–Echo Technique for Functional MRI," *Magnetic Resonance In Medicine* 35:870–874, XP 000594138 (1996).

* cited by examiner

*Primary Examiner*—Louis Arana
(74) *Attorney, Agent, or Firm*—Connolly Bove Lodge & Hutz LLP; Myron K. Wyche

(57) ABSTRACT

The invention relates to an imaging method. Layer or volume areas are selected by radiating high-frequency pulses and applying at least one magnetic potential field. Nuclear magnetic resonances are excited and are detected as measuring signals in said areas. According to the invention, the method is carried out in such a way that different layer or volume areas are successively selected and the corresponding measuring signals are detected by means of the magnetic potential field and that layer or volume images of the individual layer or volume areas are produced after the measuring signals for the different layer or volume areas have been detected.

5 Claims, 2 Drawing Sheets

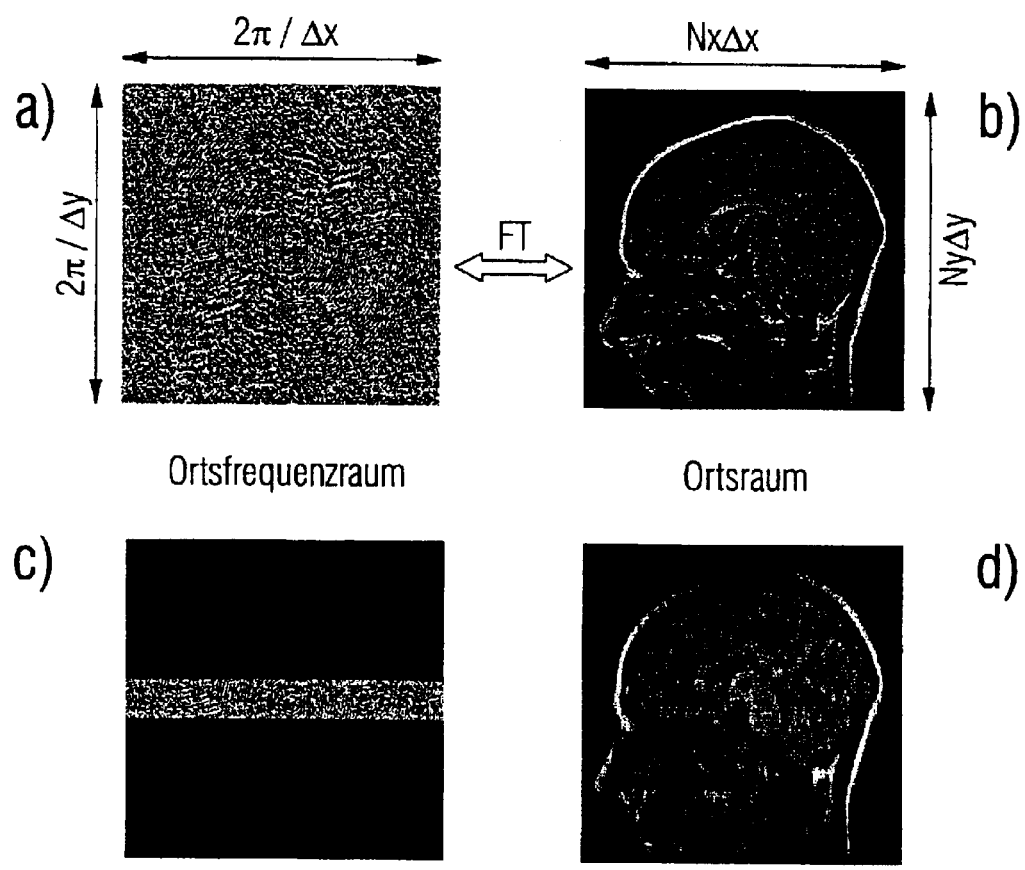

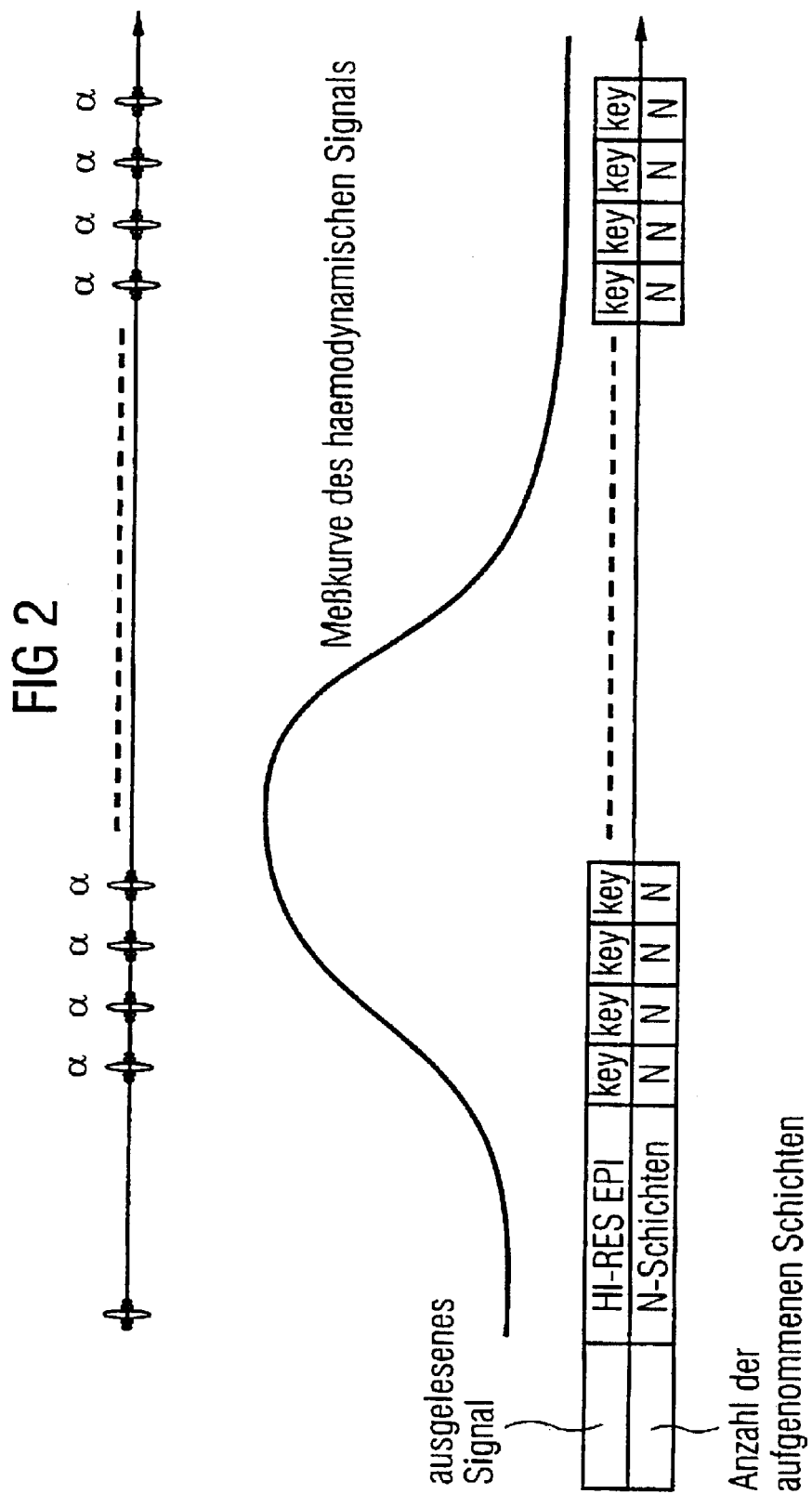

IMAGING METHOD

FIELD OF THE INVENTION

The invention relates to an imaging method in which high-frequency pulses are emitted and at least one magnetic gradient field is applied in order to select slice or volume areas in which nuclear magnetic resonances are excited and detected as measuring signals.

BACKGROUND OF THE INVENTION

Nuclear magnetic resonance tomography is employed, among other things, to obtain spectroscopic information or image information about a given substance. A combination of nuclear magnetic resonance tomography with the techniques of magnetic resonance imaging (MRI) provides a spatial image of the chemical composition of the substance.

Magnetic resonance imaging is, on the one hand, a tried and true imaging method that is employed clinically worldwide. On the other hand, magnetic resonance imaging constitutes a very important examination tool for industry and research outside the realm of medicine as well. Examples of applications are the inspection of food products, quality control, pre-clinical testing of drugs in the pharmaceutical industry or the examination of geological structures, such as pore size in rock specimens for oil exploration.

The special strength of magnetic resonance imaging lies in the fact that very many parameters have an effect on nuclear magnetic resonance signals. A painstaking and controlled variation of these parameters allows experiments to be performed that are suitable to show the influence of the selected parameter.

Examples of relevant parameters are diffusion processes, probability density distributions of protons or a spin-lattice relaxation time.

In nuclear resonance tomography, atom nuclei having a magnetic momentum are oriented by a magnetic field applied from the outside. In this process, the nuclei execute a precession movement having a characteristic angular frequency (Larmor frequency) around the direction of the magnetic field. The Larmor frequency depends on the strength of the magnetic field and on the magnetic properties of the substance, particularly on the gyromagnetic constant $\gamma$ of the nucleus. The gyromagnetic constant $\gamma$ is a characteristic quantity for every type of atom. The atom nuclei have a magnetic momentum $\mu=\gamma \times p$ wherein p stands for the angular momentum of the nucleus.

In nuclear resonance tomography, a substance or a person to be examined is subjected to a uniform magnetic field. This uniform magnetic field is also called a polarization field Bo and the axis of the uniform magnetic field is called the z axis. With their characteristic Larmor frequency, the individual magnetic momentums of the spin in the tissue precede around the axis of the uniform magnetic field.

A net magnetization $M_z$ is generated in the direction of the polarization field, whereby the randomly oriented magnetic components cancel each other out in the plane perpendicular to this (the x-y plane). After the uniform magnetic field has been applied, an excitation field $B_1$ is additionally generated. This excitation field $B_1$ is polarized in the x-y plane and it has a frequency that is as close as possible to the Larmor frequency. As a result, the net magnetic momentum $M_z$ can be tilted into the x-y plane in such a way that a transverse magnetization $M_t$ is created. The transverse component of the magnetization rotates in the x-y plane with the Larmor frequency.

By varying the time of the excitation field, several temporal sequences of the transverse magnetization $M_t$ can be generated. In conjunction with at least one applied gradient field, different slice profiles can be realized.

Particularly in medical research, there is a need to acquire information about anatomical structures, about spatial distributions of substances as well as about brain activity or about blood flow or changes in the concentration of deoxyhemoglobin in the organs of animals and humans.

Magnetic resonance spectroscopy (MRS) makes it possible to measure the spatial density distribution of certain chemical components in a material, especially in biological tissue.

A comprehensive presentation of echo-planar spectroscopic imaging (EPSI) can be found in the article by P. Mansfield: Magn. Reson. Med., 1, page 370, 1984.

Rapid magnetic resonance imaging (MRI), in conjunction with magnetic resonance spectroscopy (MRS), allows an examination of local distributions of metabolic processes. For instance, regional hemodynamics involving changes in the blood volumes and blood states as well as changes in the metabolism can be determined in vivo as a function of brain activity; in this context, see S. Posse et al.: Functional Magnetic Resonance Studies of Brain Activation; Seminars in Clinical Neuropsychiatry, Volume 1, No. 1, 1996; pages 76 to 88.

NMR imaging methods select slices or volumes that yield a measuring signal under the appropriate emission of high-frequency pulses and under the application of magnetic gradient fields; this measuring signal is digitized and stored in a one-dimensional or multi-dimensional field in a measuring computer.

A one-dimensional or multi-dimensional Fourier transformation then acquires (reconstructs) the desired image information from the raw data collected.

A reconstructed tomograph consists of pixels, and a volume data set consists of voxels. A pixel (picture element) is a two-dimensional picture element, for instance, a square. The image is made up of pixels. A voxel (volume pixel) is a three-dimensional volume element, for instance, a right parallelepiped. The dimensions of a pixel are in the order of magnitude of 1 $mm^2$, and those of a voxel are in the order of magnitude of 1 $mm^3$. The geometries and extensions can vary.

Seeing that, for experimental reasons, it is never possible to assume a strictly two-dimensional plane in the case of tomographs, the term voxel is often employed here as well, indicating that the image planes have a certain thickness.

Due to the large differences in the signal intensity of individual chemical substances and due to movements of an object being measured, localization artifacts can occur during the imaging and spectroscopy.

Particularly in examinations of the brain, it is necessary to suppress signals from substances that are located outside of the brain but that are located inside a slice to be examined. In the case of magnetic resonance with protons ($^1H$), these are substances, for example, lipids, that contain $^1H$.

Lipids cover a rather broad frequency range that coincides with that of most metabolites. In spectroscopic examinations of the brain, it is advantageous to suppress signals from substances that are located outside of the brain but that are located inside of the slice to be examined—also referred to as lipid suppression because the signals thus generated can be much stronger than the signals in the brain regions to be examined.

In view of the fact that the lipids in the human head are primarily to be found in the periphery of the skull, one possibility of lipid suppression is to not at all excite the nuclear spins in the periphery. A spatially localized spectrum is obtained by means of signal suppression in regions located outside of a volume to be examined. Such techniques are referred to as single-voxel techniques.

A known single-voxel technique called STEAM is described in the following articles:

Garnot J. (1986): Selected volume excitation using stimulated echoes (VEST). Applications to spatially localized spectroscopy and imaging; J. Magn. Reson. 70: pages 488 to 492;

Kimmich R., Hoepfel D. (1987): Volume selective multipulse spin echo spectroscopy. J. Magn. Reson. 72: pages 379 to 384;

Frahm J., Merboldt K. D., Haenicke W. (1987): Localized proton spectroscopy using stimulated echoes. J. Magn. Reson. 72: pages 502 to 508.

Another volume localization method involving a single-voxel technique called PRESS is disclosed in U.S. Pat. No. 4,480,228 by Bottomley P. A. (1984) titled "Selective volume method for performing localized NMR spectroscopy".

Another known volume localization method involving a single-voxel technique is presented by Ordidge R. J., Bendall M. R., Gordon R. E., Conelly A.: "Volume selection for in-vivo biological spectroscopy" in the book titled "Magnetic Resonance in Biology and Medicine", published by Govil, Khetrapal and Saran, New Delhi, India, Tate McGraw-Hill Publishing Co. Ltd., page 387 (1985). In comparison to spectroscopic imaging, the known single-voxel techniques have the drawback that an examination of the spatial distribution of chemical substances is only possible to a limited extent. Another disadvantage of the known methods is that the signal suppression outside of a target volume is limited due to imperfections in the slice selection, whereby only a slight lipid suppression is achieved and/or whereby it is possible to select only rectangular target volumes. Particularly in the case of short echo times, it is difficult to avoid interferences from signals of peripheral lipids that have a short relaxation time $T_2$.

It is a known procedure to select long echo times in order to reduce the effect of lipid impurities.

Examples of embodiments can be found in the following articles:

Frahm J., Bruhn H., Gyngell M. L., Merboldt K. D., Haenicke W., Sauter R. (1989): Localized high-resolution proton NMR spectroscopy using stimulated echoes. Initial application to human brain in vivo. Magn. Reson. Med.: pages 79 to 93;

Frahm J., Bruhn H., Haenicke W., Merboldt K. D., Mursch K., Markakais E. (1991): Localized proton NMR spectroscopy of brain tumors using short-echo time STEAM sequences. J. Comp. Assist. Tomogr.: 15 (6), pages 915 to 922;

Moonen C. T. W., Sobering G., van Zijl P. C. M., Gillen J., von Kienlin M., Bizzi A. (1992): Proton spectroscopic imaging of human brain. J. Magn. Reson., 98 (3): pages 556 to 575.

The article by Adalsteinsson E., Irarrazabal P., Spielman D. M., Macovski A. (1995) titled "Three-Dimensional Spectroscopic Imaging with Time-Varying Gradients"; Magn. Reson. Med., 33: pages 461 to 466, describes three-dimensional spectroscopic imaging with lipid suppression by global inversion of the signal utilizing differences in the longitudinal relaxation between individual chemical substances.

An improved water and lipid suppression by means of spectral-selective dephasing pulses is known as the BASING technique. A description of the BASING technique can be found in the article by Star-Lack J., Nelson S. J., Kurhanewicz J., Huang R., Vigneron D. (1997) titled "Improved water and lipid suppression for 3D PRESS CSI using RF Band-Selective Inversion with Gradient Dephasing (BASING)". Magn. Reson. Med. 38: pages 311 to 321.

The BASING method comprises a frequency-selective refocusing pulse in conjunction with immediately preceding and following gradient pulses having opposite signs, which leads to dephasing.

Functional nuclear magnetic resonance makes it possible to detect dynamic changes and thus to observe processes over the course of time.

With functional magnetic resonance imaging (fMRI), images are generated that show the local changes.

It is also a known procedure to employ functional nuclear magnetic resonance, that is to say, functional nuclear magnetic resonance imaging, to examine neuronal activation. Neuronal activation is manifested by an increase of the blood flow into activated regions of the brain, whereby a drop occurs in the concentration of deoxyhemoglobin. Deoxyhemoglobin (DOH) is a paramagnetic substance that reduces the magnetic field homogeneity and thus accelerates signal relaxation. Oxyhemoglobin displays a magnetic susceptibility corresponding essentially to the structure of tissue in the brain, so that the magnetic field gradients are very small over a boundary between the blood containing oxyhemoglobin and the tissue. If the DOH concentration decreases because of a brain activity that triggers an increasing blood flow, then the signal relaxation is slowed down in the active regions of the brain. It is primarily the protons of hydrogen in water that are excited. The brain activity can be localized by conducting an examination with functional NMR methods that measure the NMR signal with a time delay (echo time). This is also referred to as susceptibility-sensitive measurement. The biological mechanism of action is known in the literature under the name BOLD effect (Blood Oxygen Level Dependent effect) and, in susceptibility-sensitive magnetic resonance measurements at a field strength of a static magnetic field of, for example, 1.5 tesla, it leads to increases of up to about 5% in the image brightness in activated regions of the brain. Instead of the endogenous contrast agent DOH, other contrast agents that cause a change in the susceptibility can also be used. Here, too, it is advantageous to suppress the lipid signals. Preference is given to using a frequency-selective lipid presaturation.

The imaging method is preferably a spectroscopic echo-planar imaging method, especially a repeated two-dimensional echo-planar imaging method, consisting of the repeated application of two-dimensional echo-planar image encoding. Spatial encoding takes place within the shortest possible period of time, which is repeated multiple times during a signal drop, preferably amounting to 20 ms to 100 ms. The multiple repetition of the echo-planar encoding during a signal drop serves to depict a course of the signal drop in the sequence of reconstructed individual images.

SUMMARY OF THE INVENTION

The invention is based on the objective of improving the resolution of the images taken and reducing the effect of interfering signals.

This objective is achieved according to the invention in that, through the magnetic gradient field, first several slice or volume areas are selected and the appertaining measuring signals are detected, and in that, following the detection of the measuring signals for various slice or volume areas, slice or volume images are formed of the individual slice or volume areas.

The image quality can be further improved in that measuring signals are detected at different points in time for at least one of the slice or volume areas.

A Fourier transformation is a suitable method for obtaining images. A fast Fourier transformation (FFT) lends itself for increasing the speed.

The echo planar imaging according to the invention is very fast, as a result of which it is particularly well-suited for detecting functional images of the entire brain, where otherwise, much longer acquisition times are needed. At a field strength, for instance, of 1.5 T, the time needed to image one slice is about 100 ms which, considering an appropriate coverage of the entire brain, for example, in 32 slices, calls for a total imaging time of about 4 seconds. The hemodynamic response curve, in contrast, should be detected in a time framework that is sufficient to perform a good data adaptation.

Through a repetition of the measurements several times at incrementally staggered time shifts, results can be obtained that correspond to measurements having a smaller grid time.

Even though this method can fundamentally be employed, it entails the drawback that repeating the measurements several times prolongs the overall measuring time and also that any instability on the part of the scanner used for the nuclear magnetic resonance test influences the measurement. Additional spatial inaccuracy arises whenever the patient moves.

With the keyhole imaging method, a signal in the reciprocal k-space is separated into two different areas, namely, first into a central area having small spatial frequencies that is responsible for providing contrast in the generated image, and secondly into outer regions of the k-space that have high spatial frequencies and that contain essential information about the spatial resolution. In the case of several consecutive measurements in which contrast changes are being examined, it is sensible for only the central area of the k-space to serve as the basis for the examination.

Additional advantages, special features and practical refinements of the invention can be found in the subordinate claims and in the presentation below of a preferred embodiment making reference to the drawings.

BRIEF DESCRIPTION OF THE DRAWINGS

The drawings show the following:

FIG. 1—k-spaces and the appertaining localization spaces in four partial images a, b, c and d, and FIG. 2—an excitation sequence that is suitable for performing the method according to the invention.

DETAILED DESCRIPTION OF THE PREFERRED EMBODIMENTS

An illustration of this method is depicted in the four partial images a, b, c and d shown in FIG. 1.

In FIG. 1, partial image a shows a k-space which, by means of a Fourier transformation, can be converted into a real space that is depicted in partial image b.

In partial image c, only 16 central lines of the k-space have been scanned. A Fourier transformation then yields the low-resolution image shown in partial image d.

In order to achieve the desired higher local resolution, a high-resolution reference image (REF<hi-res>) is first made for the keyhole method. This image is obtained by evaluating the data of an entire k-space. Subsequently, keyhole images (KEY<low-res>) are made. The high-resolution images can be expressed by the formula $$(REF<\text{hi-}res>)=(REF<\text{hi-}k>)+(REF<\text{low-}k>),$$

wherein (REF<hi-k>) refers to outer areas in the k-space while (REF<low-k>) refers to central areas in the k-space.

Dynamic images having a high resolution can be obtained on the basis of the formula $$(DYN<\text{hi-}res>)=(REF<\text{hi-}k>)+(KEY<\text{low-}res>).$$

As a result, the dynamic images are generated by central areas of the individually taken images, whereby peripheral areas of the reference image give rise to a sharp local resolution.

This method, however, has the disadvantage that variations can occur between different images, for example, in the signal-to-noise ratio (SNR), in the amplitude and/or in phase variations. These discontinuities cause image artifacts that should be corrected.

A particularly advantageous method to correct these artifacts will be presented below.

FIG. 2 depicts a sequence diagram.

The reference image was taken immediately after a stimulus in an fMRI experiment. Such imaging directly after the stimulus is especially advantageous.

Immediately thereafter, the individual measurements are carried out by imaging only the central areas of the k-space (keyhole measurements). In order to generate completely resolved images, the keyhole images are reconstructed by means of a phase correction.

A number of phase-correction methods are suitable for this purpose.

Preferred embodiments of a method according to the invention for fast spectroscopic metabolite imaging employing a nuclear spin tomograph consisting of a volume-selective signal excitation (PRESS=Point RESolved Spectroscopy) with subsequent spatial-spectral encoding (EPSI=Echo Planar Spectroscopic Imaging) are presented below.

In magnetic resonance spectroscopy (MRS), sectional images are generated with a predefined grid of $N_Y$ lines and $N_X$ columns (CSI=Chemical Shift Imaging). The preferred process steps are presented below:

1) First of all, the resonant nuclear spins located in the volume of interest of the specimen and polarized in the presence of an external magnetic field $B_0=B_0 e_Z$ are excited by means of suitable RF irradiation (RF=radio frequency) in order to generate a signal. The magnetization M, which is altogether formed by the nuclear spin, then has a measurable component $M_{XY}$ that is orthogonal to $B_0$ and that precedes with the angular velocity $\omega=-\gamma B_0$.
2) Subsequently, the signal is spatially encoded through the brief application of magnetic field gradients $G=\Delta B_0/\Delta r$, whose purpose is to vary the external magnetic field linearly with the location r. As a result, the resonant nuclear spins precede for a brief time with an additional angular frequency $\Delta\omega(r)=-\gamma G r$ and emit a phase-modulated MR signal after the gradient G has been switched off.
3) This modulated MR signal is then scanned for a sufficiently long time, that is to say, about as long as necessary for $M_{XY}$ to become completely dephased, and at sufficiently short time intervals.
4) Steps 2 and 3 are repeated as many times as the sectional image is supposed to have grid points, in other words, ($N_Y$* $N_X$) times. With each repetition, the gradient strength G or the time duration of the application is varied, as is needed for a correct spatial encoding.

5) A digital computer is then employed to further process the data points thus acquired and ultimately to compute the sectional images.

The execution, however, can also be completed with just some of the steps described. For instance, the second and fourth steps can be dispensed with if spatially resolved encoding is not needed. This results in spatially resolved frequency spectra on the basis of which the relative concentration of individual chemical components can be computed. These can be distinguished because the effective magnetic field at the location of a nucleus and thus also its precession frequency are a function of its parent molecule, which shields the external magnetic field to a greater or lesser extent.

When it comes to the examination of biological tissue, it is most advantageous to select protons as the resonant nuclei. In this context, the very strong signals of the water and of the lipids at concentrations in the double-digit molar range are to be suppressed so that the metabolic products (metabolites) of interest can be detected in the millimolar range. The signal of the water protons is relatively easy to suppress since it is present virtually isolated in the frequency spectrum, as a result of which it can be eliminated by appropriate RF irradiation. There are combinations of CHESS pulses (CHESS=CHEmical Shift Selective) with which suppression factors of up to 3000 can be attained.

In order to reduce the measuring duration by more than one order of magnitude in spatially resolved spectroscopy, the phase encoding can be partially combined with the read-out of the MR signal. The advantage lies in a measuring duration that is shortened by the factor $N_X$.

Once this read-out of the measured data has been completed, the measured data is reinterpreted in a suitable manner, preferably as ($k_X$, $k_Y$) slices at various points in time t. Formally, this is done by rearranging the measured data. Subsequently, the data can be further processed by means of commonly employed methods of familiar spectroscopic imaging.

The coordinates ($k_X$, $k_Y$) given here are only an example. The person skilled in the art can select suitable ($k_X$, $k_Y$) for each examination.

What is claimed is:

1. An echo-planar imaging method in which high-frequency pulses are emitted;
   at least one magnetic gradient field is applied in order to select slice or volume areas in which nuclear magnetic resonances are excited and ascertained as measuring signals whereby, through the magnetic gradient field, several slice or volume areas are consecutively selected and the appertaining measuring signals are detected, and whereby, following the detection of the measuring signals for various slice or volume areas, slice or volume images are formed of the individual slice or volume areas, and a high-resolution reference image (REF<hi-res>) is made, in that additional images having a lower resolution (KEY<low-res>) are made and in that the resolution of the additional images is improved by being linked to the reference image (REF<hi-res>); and
   keyhole images are reconstructed by means of a phase correction in order to generate completely resolved images.

2. The method according to claim 1, wherein first the high-resolution reference image (REF<hi-res>) is made and in that subsequently the additional images (KEY<low-res>) are made.

3. The method according to claim 1, wherein the linking of the additional images with the reference image (REF<hi-res>) is improved, essentially in accordance with the formula (REF<hi-res>)=(REF<hi-k>)+(REF<low-k>), wherein (REF<hi-k>) refers to outer areas in the k-space while (REF<low-k>) refers to central areas in the k-space.

4. The method according to claim 3, wherein measuring signals are detected at different points in time for at least one of the slice or volume areas.

5. The method according to claim 3, wherein the measuring signals undergo a Fourier transformation.

* * * * *